(12) United States Patent
Kasahara

(10) Patent No.: US 11,798,806 B2
(45) Date of Patent: Oct. 24, 2023

(54) PATTERN FORMING METHOD AND METHOD FOR MANUFACTURING SEMICONDUCTOR DEVICE

(71) Applicant: Kioxia Corporation, Tokyo (JP)

(72) Inventor: Yusuke Kasahara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/465,485

(22) Filed: Sep. 2, 2021

(65) Prior Publication Data

US 2022/0301872 A1 Sep. 22, 2022

(30) Foreign Application Priority Data

Mar. 17, 2021 (JP) ................................. 2021-043157

(51) Int. Cl.
H01L 21/033 (2006.01)
H01L 21/027 (2006.01)
G03F 7/00 (2006.01)

(52) U.S. Cl.
CPC ........ *H01L 21/0337* (2013.01); *G03F 7/0002* (2013.01); *H01L 21/0276* (2013.01); *H01L 21/0338* (2013.01)

(58) Field of Classification Search
None
See application file for complete search history.

(56) References Cited

U.S. PATENT DOCUMENTS

| 4,613,398 | A | 9/1986 | Chiong et al. |
| 7,615,497 | B2 | 11/2009 | Bok et al. |
| 10,395,899 | B2 | 8/2019 | Saito et al. |
| 10,937,652 | B1 * | 3/2021 | Tien ................. H01L 21/76816 |

FOREIGN PATENT DOCUMENTS

| JP | S61-284924 A | 12/1986 |
| JP | 2019-054062 A | 4/2019 |

* cited by examiner

*Primary Examiner* — Roberts P Culbert
(74) *Attorney, Agent, or Firm* — Foley & Lardner LLP

(57) ABSTRACT

A pattern forming method includes: forming a first film on a first region of a processing target film; forming a second film containing metal and carbon and different from the first film, on a second region of the processing target film; etching the first film; and etching the processing target film using the first film after the etching while the second film is exposed.

19 Claims, 15 Drawing Sheets

PATTERN FORMING METHOD AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2021-043157, filed on Mar. 17, 2021, the entire contents of which are incorporated herein by reference.

FIELD

Embodiments described herein relate generally to a pattern forming method and a method for manufacturing a semiconductor device.

BACKGROUND

In a semiconductor device, a three-dimensional structure in which elements are stacked in the vertical direction is applied for high integration. As a result, in a process for manufacturing a semiconductor device, a demand for a technology for forming a pattern such as a hole or a groove having a high aspect ratio has been increased. Since a mask pattern used in such process is exposed to an etching gas for a long time, high etch resistance is required, and at the same time, it is required to maintain a pattern shape such as a hole or a groove having a high aspect ratio as much as possible during etching.

DETAILED DESCRIPTION

Figure 1:
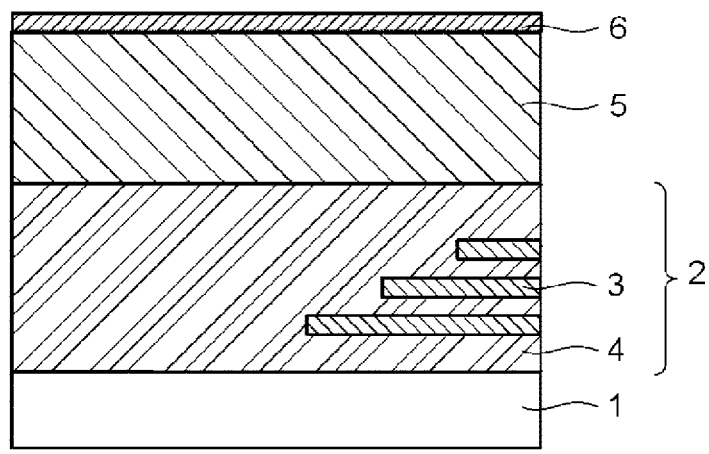
FIG. 1 is a cross-sectional view illustrating one process in a pattern forming method and a method for manufacturing a semiconductor device according to a first embodiment.

Embodiments provide a pattern forming method and a method for manufacturing a semiconductor device capable of providing high etch resistance of a mask, and maintaining a pattern shape having a high aspect ratio.

In general, according to at least one embodiment, a pattern forming method includes: forming a first film on a first region of a processing target film; forming a second film containing metal and carbon and different from the first film, on a second region of the processing target film; etching the first film; and etching the processing target film using the first film after the etching while the second film is exposed.

Hereinafter, a pattern forming method and a method for manufacturing a semiconductor device according to embodiments will be described with reference to the drawings. In each of the embodiments, substantially the same components are designated by the same reference numerals, and the description thereof may be partially omitted. The drawings are schematic, and the relationship between the thickness and the plane dimension, and the ratio of the thickness of each component may be different from reality.

First Embodiment

Figure 9:
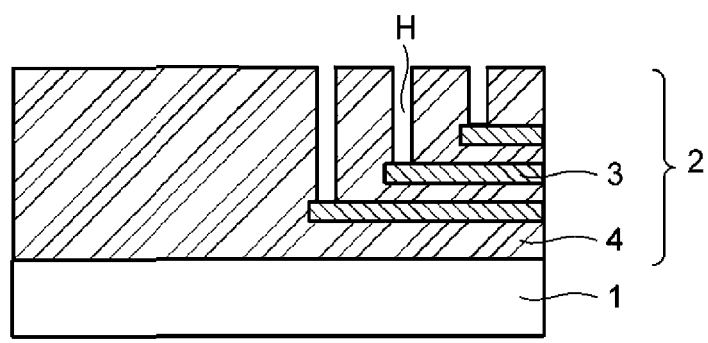
FIG. 9 is a cross-sectional view illustrating one process in the method for manufacturing a semiconductor device according to the first embodiment.
Figure 10:
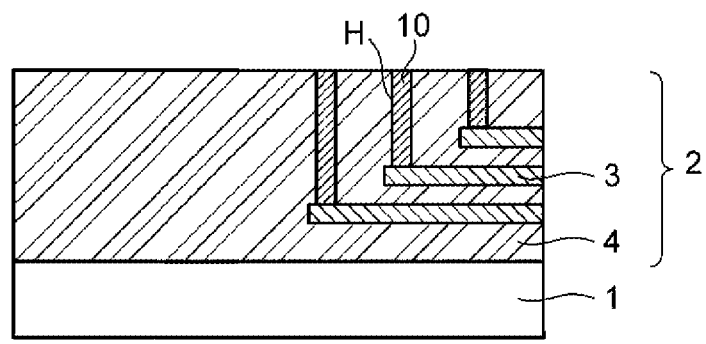
FIG. 10 is a cross-sectional view illustrating one process in the method for manufacturing a semiconductor device according to the first embodiment.
Figure 11:
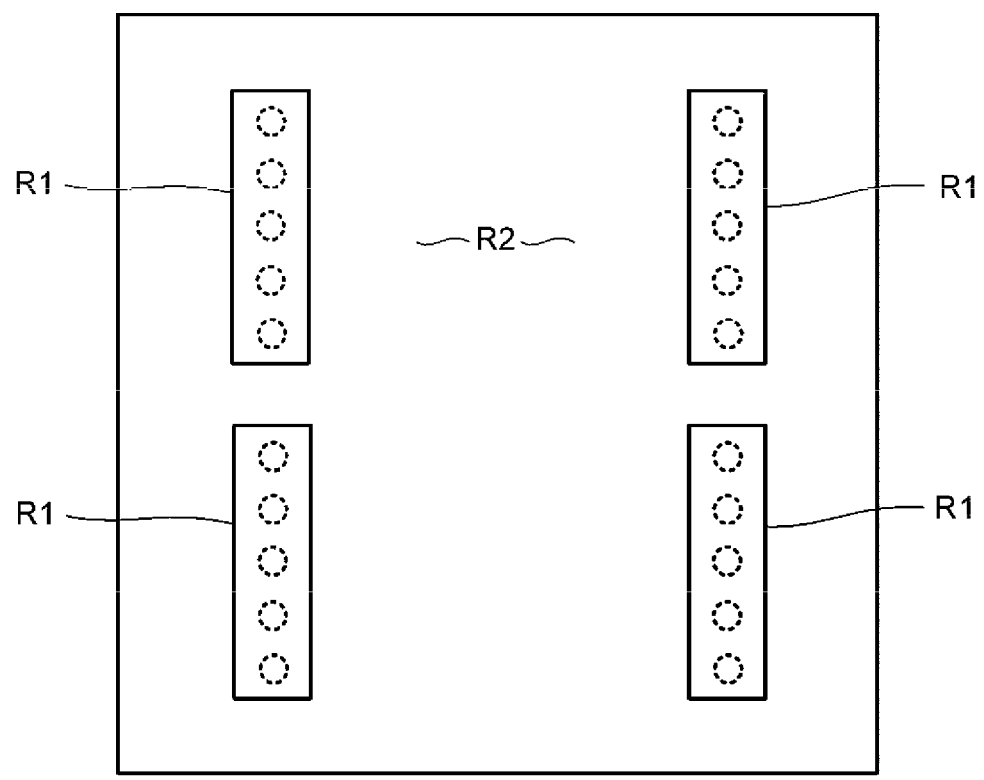
FIG. 11 is a plan view illustrating one process in the pattern forming method and the method for manufacturing a semiconductor device illustrated in FIG. 1.
Figure 12:
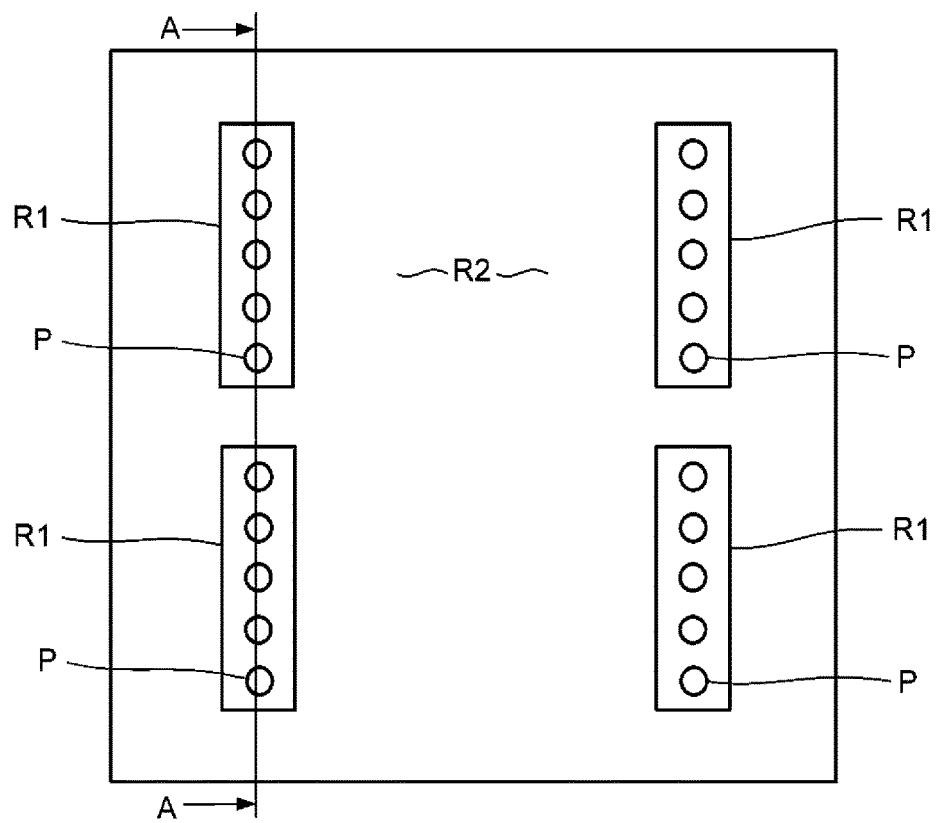
FIG. 12 is a plan view illustrating one process in the pattern forming method and the method for manufacturing a semiconductor device illustrated in FIG. 6.
Figure 13:
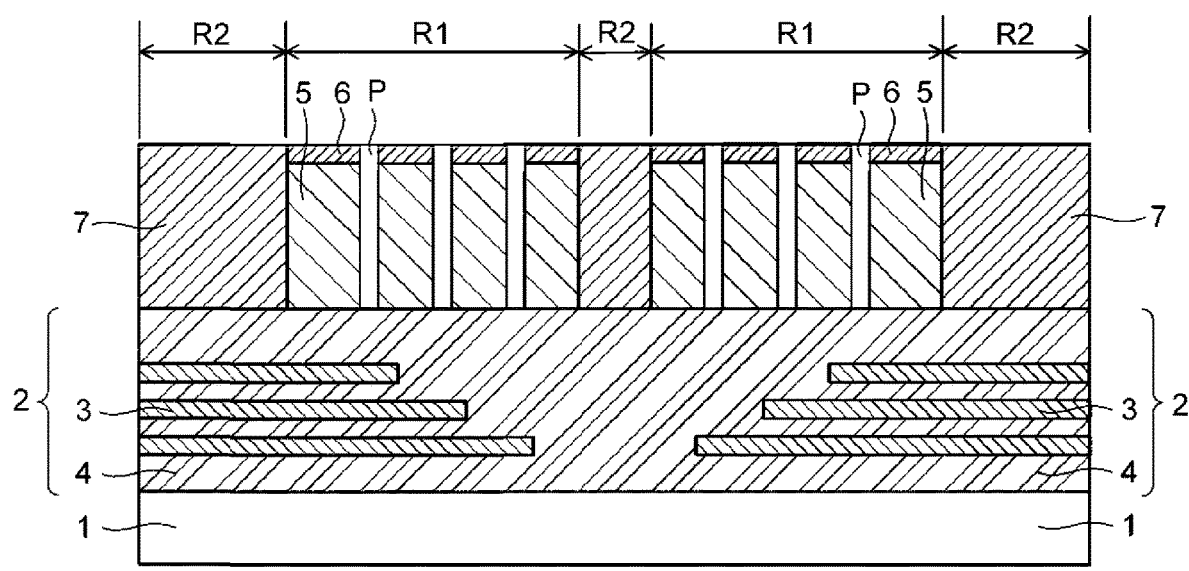
FIG. 13 is a cross-sectional view taken along line A-A in the plan view illustrated in FIG. 12.
Figure 14:
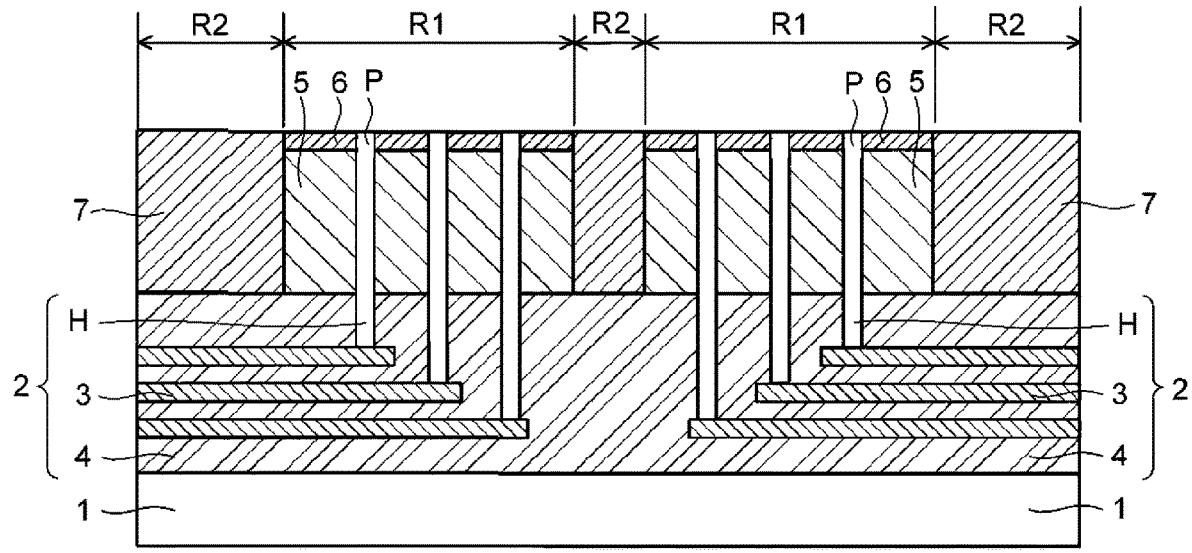
FIG. 14 is a cross-sectional view illustrating a process in the pattern forming method and the method for manufacturing a semiconductor device, following FIG. 13.
Figure 15:
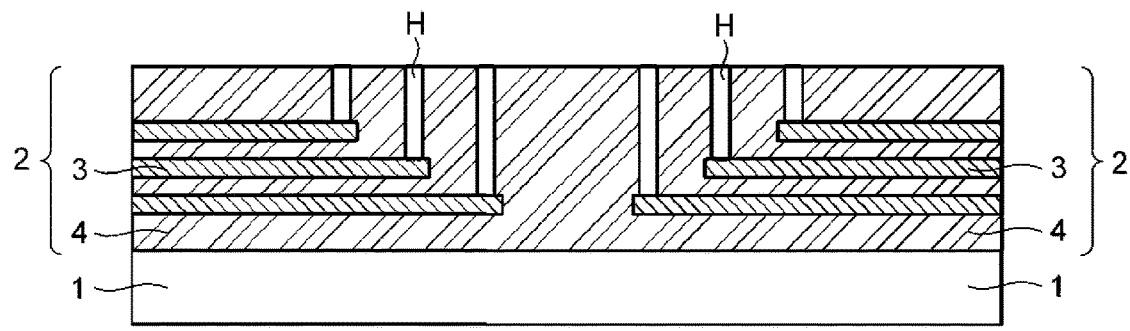
FIG. 15 is a cross-sectional view illustrating a process in the method for manufacturing a semiconductor device, following FIG. 14.
Figure 16:
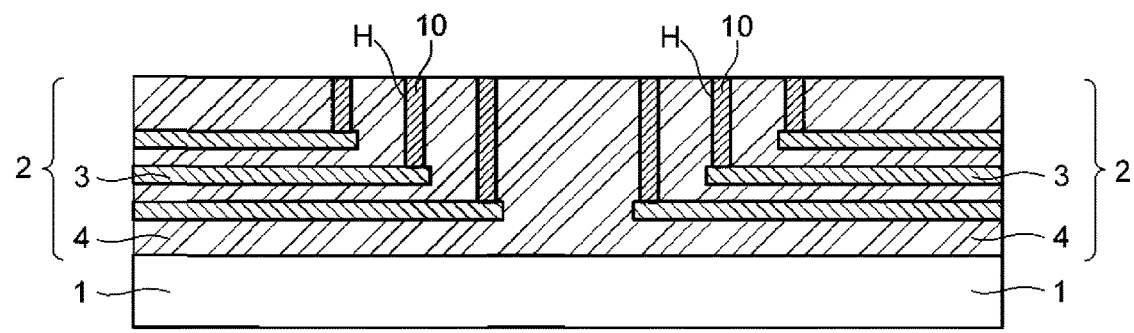
FIG. 16 is a cross-sectional view illustrating a process in the method for manufacturing a semiconductor device, following FIG. 15.

A pattern forming method and a method for manufacturing a semiconductor device according to a first embodiment will be described with reference to the FIGS. 1 to 16. FIGS. 1 to 8 are cross-sectional views illustrating each process of the pattern forming method and the method for manufacturing a semiconductor device according to the embodiment, and FIGS. 9 and 10 are cross-sectional views illustrating each process of the method for manufacturing a semiconductor device, following FIG. 8. FIG. 11 is a plan view illustrating one process in the pattern forming method and the method for manufacturing a semiconductor device illustrated in FIG. 1, and FIG. 12 is a plan view illustrating one process in the pattern forming method and the method for manufacturing a semiconductor device illustrated in FIG. 6. FIG. 13 is a cross-sectional view corresponding to the plan view illustrated in FIG. 12, and FIG. 14 is a cross-sectional view illustrating a process of the method for manufacturing a semiconductor device, following FIG. 13. FIGS. 15 and 16 are cross-sectional views illustrating each process of the method for manufacturing a semiconductor device, following FIG. 14.

First, as illustrated in FIG. 1, a processing target film 2 formed on a substrate 1 such as a semiconductor substrate is prepared. The processing target film 2 may be formed on the substrate 1 via, for example, other films or layers. In the first embodiment, an insulating film 4 made of, for example, silicon oxide ($SiO_2$) in which a wiring layer 3 is disposed may be applied as the processing target film 2. Inside the insulating film 4, a plurality of wiring layers 3 extending in a first direction along the surface of the substrate 1 is stacked to be separated from each other in a second direction orthogonal to the first direction. The plurality of wiring layers 3 have different lengths in the first direction, and one end thereof is disposed in a stair shape such that the end portion of the wiring layer 3 on a lower end side is projected by turns.

A film containing carbon as a first film 5, for example, a carbon film is formed on the processing target film 2 formed on the substrate 1. The first film 5 is used as a mask during etching (to be described later), and for example, is an inorganic carbon film (CVD-carbon film) formed by a chemical vapor deposition (CVD) method. The first film 5 is not limited to the carbon film, and may be any material that has an appropriate etching rate with respect to the etching gas, and is not infiltrated with metal when forming a second film (to be described later). For example, an amorphous silicon (a-Si) film may be applied to the first film 5 instead of the carbon film. An anti-reflection film (dielectric anti-reflection coating; DARC) 6 is formed on the first film 5 as needed. For example, silicon oxide ($SiO_2$) or silicon oxynitride (SiON) is applied to the anti-reflection film 6. At this point, the first film 5 and the anti-reflection film 6 are formed on the entire processing target film 2.

Figure 2:
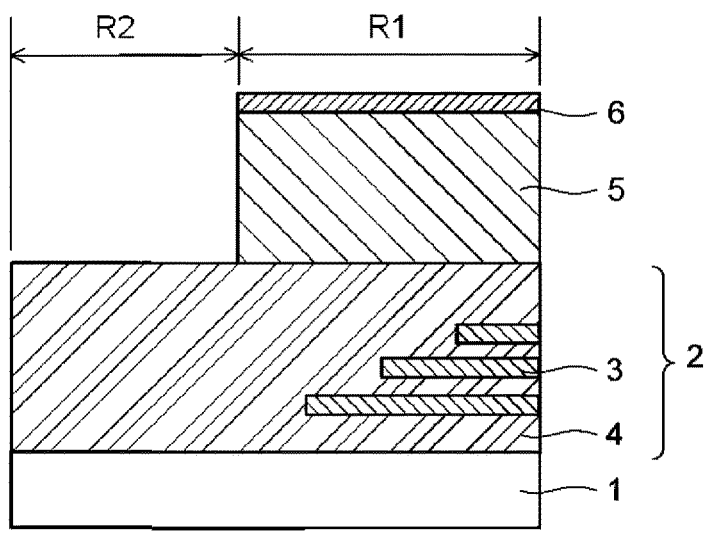
FIG. 2 is a cross-sectional view illustrating one process in the pattern forming method and the method for manufacturing a semiconductor device according to the first embodiment.

Next, the first film 5 and the anti-reflection film 6 are partially etched according to a first region and a second region of the first film 5. As illustrated in FIG. 11, as for the first region and the second region, a pattern forming region of the processing target film 2, that is, a region in the processing target film 2 in which a pattern such as a hole or a groove such as a contact hole H (to be described later) is formed serves as a first region R1, and the other region serves as a second region R2. By applying a lithography process, a portion corresponding to the first region R1 of the anti-reflection film 6 provided on the first film 5 is covered with a resist film (not illustrated). Next, a pattern of the resist film is transferred to the anti-reflection film 6 by dry etching, and the pattern of the anti-reflection film 6 is further transferred to the first film 5. For example, reactive ion etching (RIE) or ion beam etching (IBE) is applied to the dry etching. In this manner, as illustrated in FIG. 2, the portion corresponding to the second region R2 of the first film 5 and the anti-reflection film 6 not covered with the resist film is etched and removed.

Figure 3:
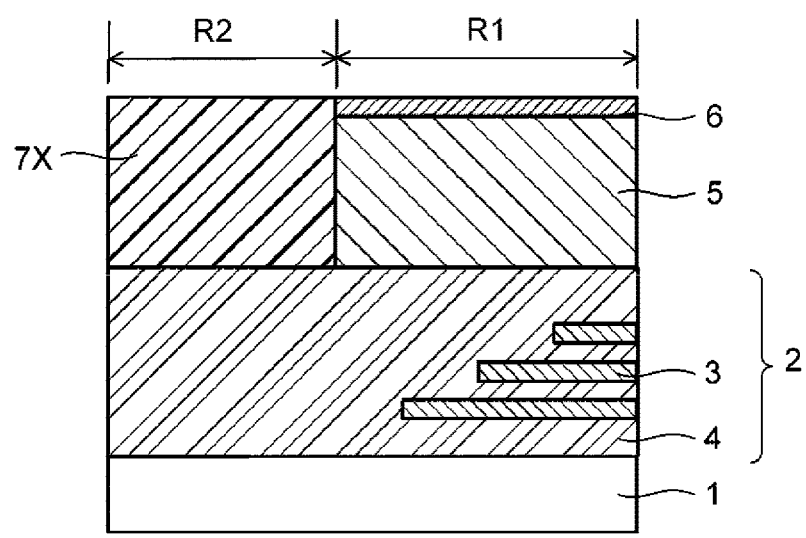
FIG. 3 is a cross-sectional view illustrating one process in a pattern forming method and a method for manufacturing a semiconductor device according to the first embodiment.

Next, a second film 7 is formed in the second region R2 of the first film 5. The second film 7 is a film containing metal and carbon, for example, an organic film containing metal, and a method for forming the second film 7 may include a method in which, first, an organic film is formed, then the organic film is infiltrated with metal (here, referred to as a "metal infiltration method (metallization method)"), and a method in which a metal-containing organic film is directly formed. The metallization method will be described with reference to FIGS. 3 and 4. First, as illustrated in FIG. 3, an organic film 7X is formed by applying, for example, a spin coating method. For example, as the organic film 7X, a resin film such as a spin on carbon (SOC) film is applied. At this time, it is desirable to form the organic film 7X such that the film thickness is equal to the total film thickness of the first film 5 such as the CVD-carbon film and the anti-reflection film 6. When the thicknesses are not equal to each other, the organic film 7X is applied thicker than the total film thickness of the first film 5 and the anti-reflection film 6, and etch-back is performed until the anti-reflection film 6 is exposed, and thus, the film thicknesses may be equal to each other.

Figure 4:
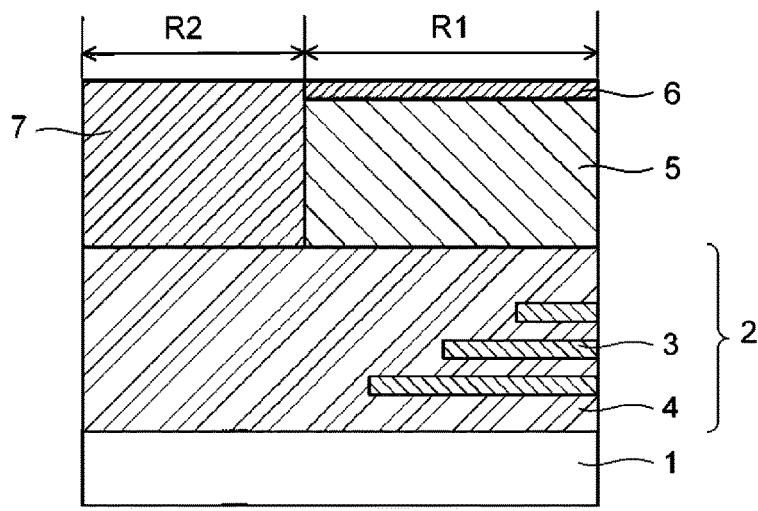
FIG. 4 is a view illustrating one process in the pattern forming method and the method for manufacturing a semiconductor device according to the first embodiment.

For the organic film 7X, an organic material (resin material) containing a group having an oxygen double bonding such as a carbonyl group, a carboxy group, and a sulfonyl group is used. As illustrated in FIG. 4, the organic film 7X is infiltrated with metal to form the second film 7 in the second region R2 of the first film 5. For the metal infiltration, for example, the substrate 1 on which the organic film 7X is formed is put into a vacuum bath, and is heated to about 80° C. to 300° C., and then, an organic metal gas as a precursor gas containing metal is introduced. As the metal, it is desirable to select an element having a low vapor pressure of a substance produced by reacting with the etching gas when the processing target film 2 is processed. In the embodiment, fluorocarbon is used as the etching gas when the processing target film 2 is processed. In this case, it is desirable to select an element having a low vapor pressure of metal fluoride.

As the precursor gas containing metal, for example, trimethylaluminum (TMA) ($Al(CH_3)_3$) is used. The temperature of the substrate 1 is set to 200° C., and TMA is introduced at 900 Pa and the substrate 1 is exposed for ten minutes. Further, water vapor is introduced to oxidize the metal, and the metal is immobilized in the resin that constitutes the organic film 7X. In this manner, as illustrated in FIG. 4, aluminum is bonded to the double bonding portion of oxygen in the organic film 7X to form the second film 7 made as a metal-containing organic film.

Here, the metal infiltrated with the organic film 7X is not limited to aluminum, and at least one selected from a group consisting of aluminum (Al), titanium (Ti), zirconium (Zr), hafnium (Hf), vanadium (V), tungsten (W), and indium (In) may be used. Further, the precursor gas containing metal is not limited to TMA, and a metal compound of the target metal such as an organic compound or a metal halide may be used. Examples of the metal compound that may be used may include $AlCl_3$, $TiCl_4$, $WCl_6$, $VCl_4$, $HfCl_4$, $ZrCl_4$, and $Al(CH_3)_3$, but are not particularly limited thereto.

A method in which a metal-containing organic film is formed using a method other than the metallization method will be described. In the state illustrated in FIG. 2 in which the second region R2 of the first film 5 and the anti-reflection film 6 is etched and removed, instead of the SOC film, an organic solvent containing metal is spin-coated to form a metal-containing organic film. As the metal, at least one selected from a group consisting of Al, Ti, Zr, Hf, V, W, and In may be used. Since the metal-containing organic film contains metal from the time of applying, the metal infiltration process described above becomes unnecessary. Also in this manner, the second film 7 made of the metal-containing organic film may be formed in the second region R2 of the first film 5.

Figure 5:
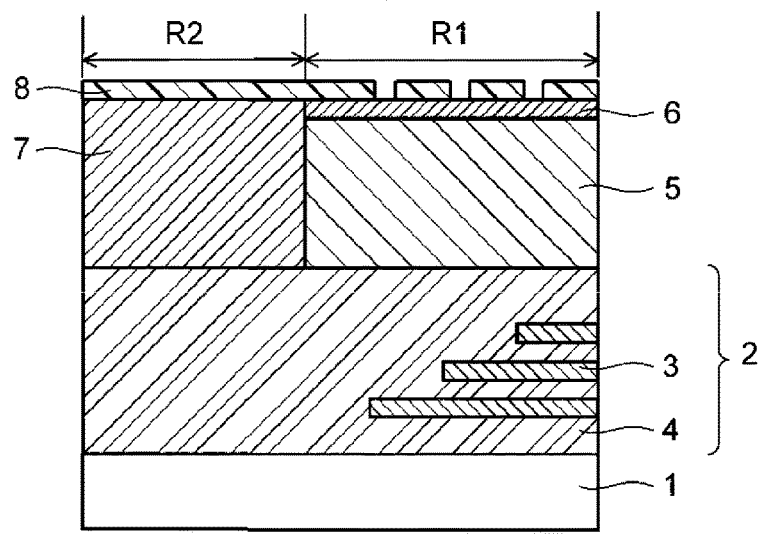
FIG. 5 is a cross-sectional view illustrating one process in the pattern forming method and the method for manufacturing a semiconductor device according to the first embodiment.

Next, as illustrated in FIG. 5, a resist film 8 is formed on the anti-reflection film 6 provided on the first film 5 and the second film 7, and then, a lithography process is applied to the portion corresponding to the first region R1 of the resist film 8 to form a desired resist pattern. Here, a hole pattern having a diameter of 150 nm is formed. The resist pattern is transferred to the anti-reflection film 6 by, for example, RIE, and is further transferred to the first film 5 using the anti-reflection film 6 as a mask. When the first film 5 is processed, the second film 7 which is a metal-containing film, is also exposed to the surface, but the etching of the second film 7 may be prevented using a gas such as $O_2$, CO, or carbonyl sulfide (COS) containing an oxygen atom, or $N_2$ gas or $CH_4$ gas, or a mixed gas thereof as the etching gas. That is, when a gas system that does not contain halogen element is used, the metal-containing film is hardly etched. Meanwhile, when the CVD-carbon film reacts with oxygen atoms, it becomes CO or $CO_2$ and gasifies, and thus, the CVD-carbon film may be etched. That is, it is possible to take a selectivity between the first film 5 such as the CVD-carbon film and the second film 7 which is a metal-containing organic film, and thus, a pattern may be transferred to the CVD-carbon film while leaving the metal-containing organic film.

Figure 6:
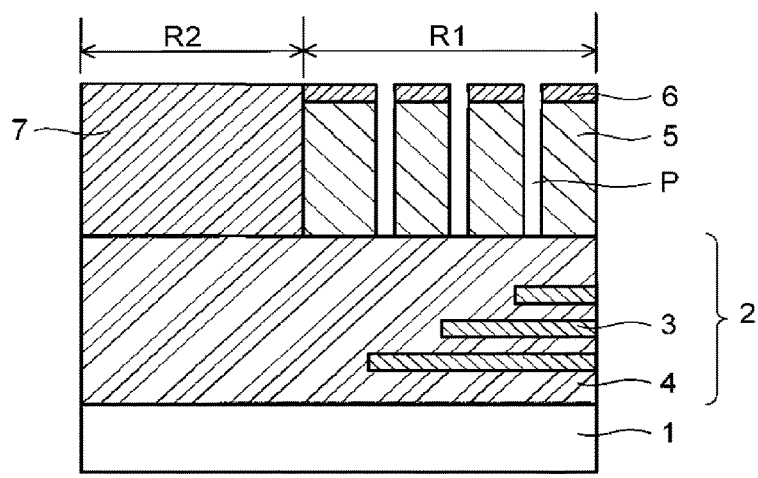
FIG. 6 is a cross-sectional view illustrating one process in the pattern forming method and the method for manufacturing a semiconductor device according to the first embodiment.

In this manner, as illustrated in FIG. 6, a hole pattern P is formed in the anti-reflection film 6 and the first film 5 such as the CVD-carbon film. The first film 5 having the hole pattern P functions as a mask when the processing target film 2 is processed. The first region R1 in which the hole pattern P is formed has a stacked structure of the first film 5 such as the CVD-carbon film and the anti-reflection film 6. The second region R2 having the second film 7 including the metal-containing organic film exists to surround the first region R1. Here, the number of stacked layers of the wiring layer 3 is three for simplification, but the number of stacked layers of the wiring layer 3 may be increased or decreased as needed.

Here, FIG. 11 illustrates four element blocks each having the first region R1 and divided by a groove pattern (not illustrated). FIGS. 1 to 6 illustrate one first region R1 and an adjacent second region R2 in the plan view illustrated in FIG. 11. FIG. 12 illustrates a state where each of the processes illustrated in FIGS. 1 to 6 is applied to the four element blocks illustrated in the plan view in FIG. 11, and the hole pattern P is formed in each of the four first regions R1. FIG. 13 is a cross-sectional view taken along line A-A in FIG. 12. As illustrated in FIG. 13, one stacked wiring layer 3 may constitute one block, and two adjacent stacked wiring layers 3 may constitute one block.

Figure 7:
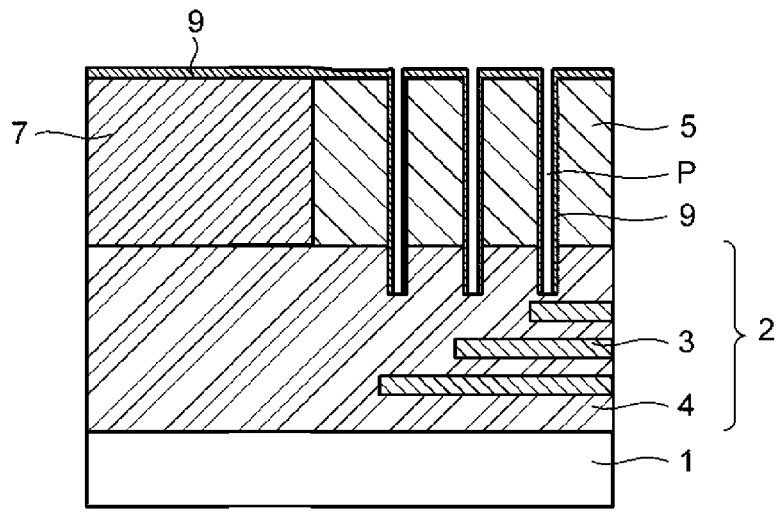
FIG. 7 is a cross-sectional view illustrating one process in the pattern forming method and the method for manufacturing a semiconductor device according to the first embodiment.
Figure 8:
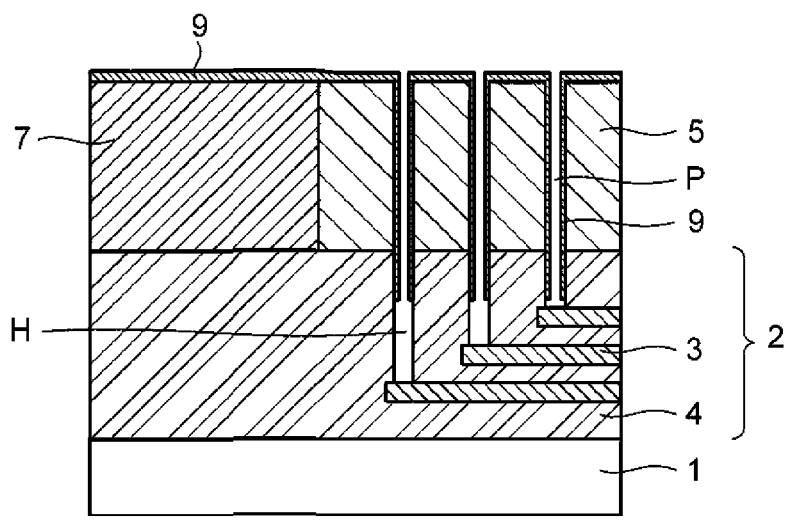
FIG. 8 is a cross-sectional view illustrating one process in the pattern forming method and the method for manufacturing a semiconductor device according to the first embodiment.

Next, as illustrated in FIG. 7, a $SiO_2$ film which is the processing target film 2, is processed using the first film 5 such as the CVD-carbon film, and the anti-reflection film 6 as a mask. The mask at this time is the first film 5 such as the CVD-carbon film, but the metal-containing organic film in the second region R2 is also etched at the same time. By etching the metal-containing organic film, metal-containing byproducts are produced. The produced byproducts are deposited on the surface of the first film 5 or the anti-reflection film 6, and further, in the hole pattern P. In FIG. 7, the reference numeral 9 indicates a metal-containing deposit deposited on the surface or in the pattern. As illustrated in FIG. 7, since the deposit 9 is also formed in the hole pattern P of the first film 5, and the deposit 9 contains metal, etching is inhibited. Therefore, the etching rate of the mask is decreased as compared to a carbon film that does not contain metal such as the CVD-carbon film. As illustrated in FIG. 7, the processing target film 2 is etched using the first film 5 having the hole pattern P as a mask by applying dry etching such as RIE or IBE to form a contact hole H in the processing target film 2. At this time, since the aspect ratio of the processing target film 2 is high, the deposit 9 is less attached to the hole bottom of the processing target film 2, and thus, the etching rate of the processing target film 2 is not decreased when forming the contact hole H.

In the embodiment, an organic film containing 20 atom % of Al is used as the metal-containing organic film. As the etching gas, a mixed gas of a fluorocarbon-based gas such as $C_4F_8$, $C_4F_6$, $C_5F_8$, $CF_4$, $CHF_3$, $CH_2F_2$, and $CH_3F$, and $O_2$, CO, $CO_2$, $N_2$, He, Ar, Kr, and Xe is used. Here, etching is performed by using a mixed gas of $C_4F_6$, $O_2$, $N_2$, and Ar as the etching gas. Under such etching conditions, the etching rate of the first film 5 which is the mask is decreased by 15%, and the etching rate of SiO$_2$ which is the processing target film 2 is not decreased. When the etching rate of the processing target film 2 is decreased or it is required to further decrease the etching rate of the mask, it may be adjusted by changing the metal concentration in the metal-containing organic film, or increasing the area of the first region R1 to reduce the area of the second region R2. While the processing target film 2 is processed, the metal-based deposit 9 is continuously supplied from the metal-containing organic film, and thus, it is possible to maintain a state having a high selectivity until the end of etching.

In this manner, as illustrated in FIGS. 9 and 15, a recess such as the contact hole H having a predetermined depth may be formed in the first region R1 of the processing target film 2. Here, as illustrated in FIG. 13, for example, when two first regions R1 are adjacent to each other, as illustrated in FIG. 14, a plurality of contact holes H is formed in each first region R1. One of a plurality of wiring layers 3 is exposed in the plurality of contact holes H formed in the first region R1, respectively. That is, the bottom portion of one contact hole H reaches each of the plurality of wiring layers 3 disposed in a stair shape.

After processing the processing target film 2 by applying each process of the pattern forming method, as illustrated in FIGS. 9 and 15, the first film 5 such as the CVD-carbon film, the anti-reflection film 6, the second film 7 which is the metal-containing organic film, and the deposit 9 containing metal in the contact hole H are removed by applying an asking process or a wet etching process. Thereafter, as illustrated in FIGS. 10 and 16, a functional material such as a metal material 10 such as W serving as a conductive material is embedded in the contact hole H, and further, the surface is flattened by chemical mechanical polishing (CMP), and thus, a semiconductor device having a desired contact portion may be obtained.

An example in which the pattern forming method of the embodiment is applied to the formation of the contact hole H which is the forming site of the connection wiring to the wiring layer 3 provided in the insulating film is described with reference to FIGS. 1 to 16, but the pattern forming method of the embodiment is not limited thereto. For example, the pattern forming method of the embodiment may be applied to the formation of a memory hole in a manufacturing process of a three-dimensional stacked non-volatile memory device having a memory cell having a vertical transistor structure. That is, the pattern forming method of the embodiment may be applied when forming a memory hole or a contact hole with respect to a stacked film of a silicon nitride film and a silicon oxide film applied to form a memory cell.

Second Embodiment

Next, an example in which the metal-containing organic film which is the second film is formed to be thick will be described with reference to FIGS. 17 to 26. For example, this example is applied to a case where the CVD-carbon film which is the first film and the metal-containing organic film which is the second film have different etching rates, and the metal-containing organic film having a larger etching rate is formed thicker than the CVD-carbon film to avoid loss of the mask. First, the CVD-carbon film 5 and the anti-reflection film 6 are formed as the first film on the processing target film 2 formed on the substrate 1, and then, as illustrated in FIG. 2, the portion of the CVD-carbon film 5 and the anti-reflection film 6 corresponding to the second region R2 of the first film is etched and removed.

Figure 17:
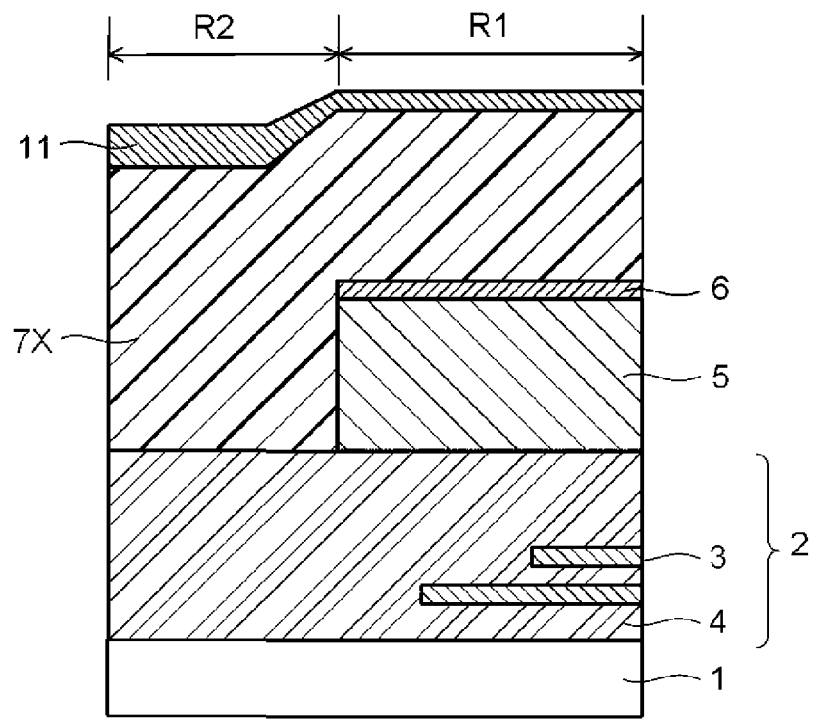
FIG. 17 is a cross-sectional view illustrating one process in a pattern forming method and a method for manufacturing a semiconductor device according to a second embodiment.

Next, as illustrated in FIG. 17, on the second region R2 from which the CVD-carbon film 5 and the anti-reflection film 6 are removed and on the anti-reflection film 6 in the first region R1, spin on carbon (SOC) is formed as the organic film 7X by applying, for example, a spin coating method. At this time, the organic film 7X is applied to be thicker than the total film thickness of the CVD-carbon film 5 and the anti-reflection film 6. Since the first region R1 has a convex shape as illustrated in FIG. 2, a step is generated between the first region R1 and the second region R2. Similar to the first embodiment, for the organic film 7X, an organic material containing a group having an oxygen double bonding such as a carbonyl group, a carboxy group, and a sulfonyl group is used. Further, a glass-based insulating film such as spin on glass (SOG) 11 is formed on the organic film 7X by spin coating. At this time, since there is the step between the first region R1 and the second region R2, the film thickness of the SOG 11 is thicker in the second region R2 than in the first region R1.

Figure 18:
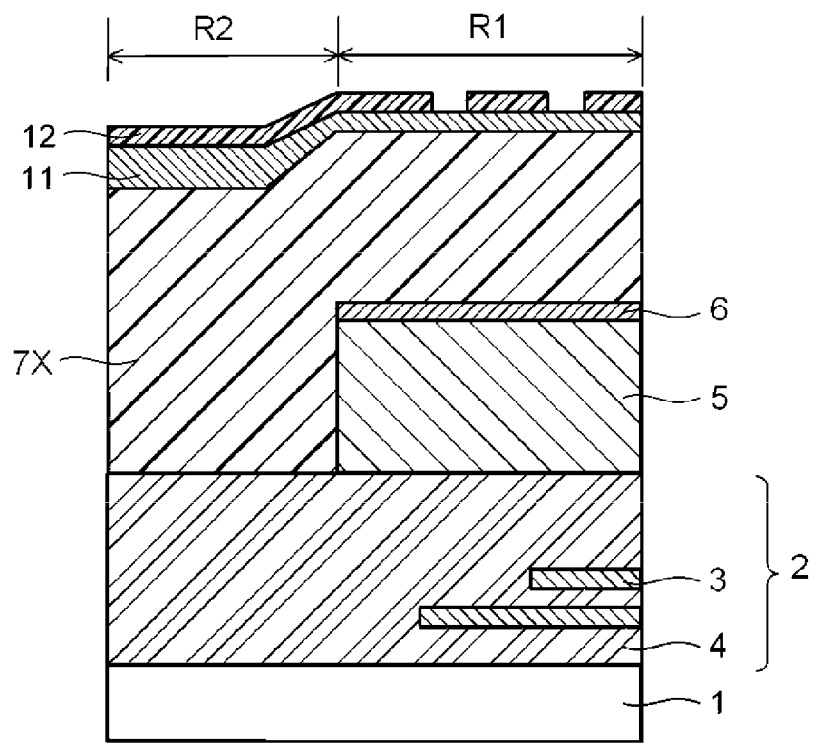
FIG. 18 is a cross-sectional view illustrating one process in the pattern forming method and the method for manufacturing a semiconductor device according to the second embodiment.
Figure 19:
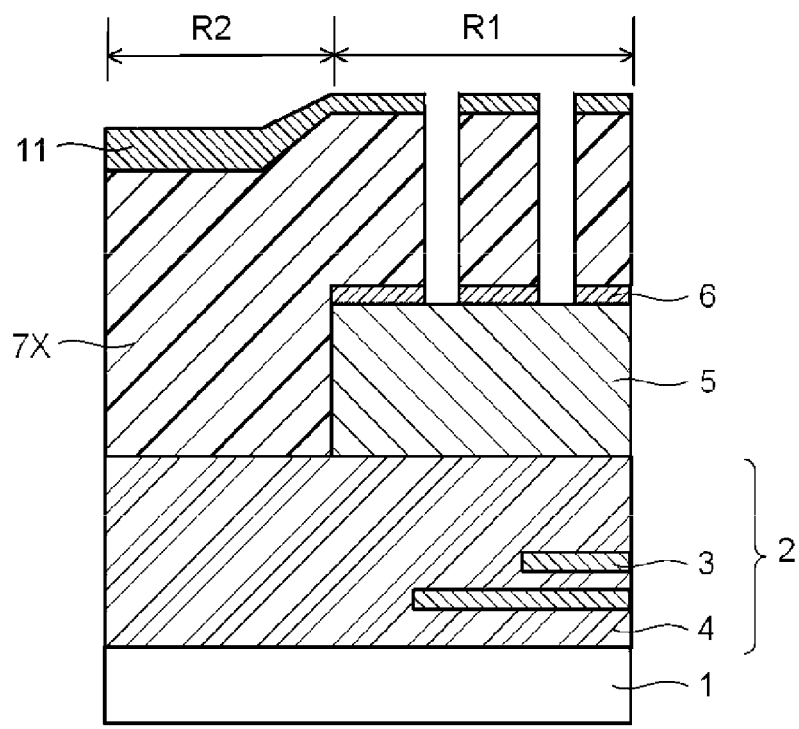
FIG. 19 is a cross-sectional view illustrating one process in the pattern forming method and the method for manufacturing a semiconductor device according to the second embodiment.
Figure 20:
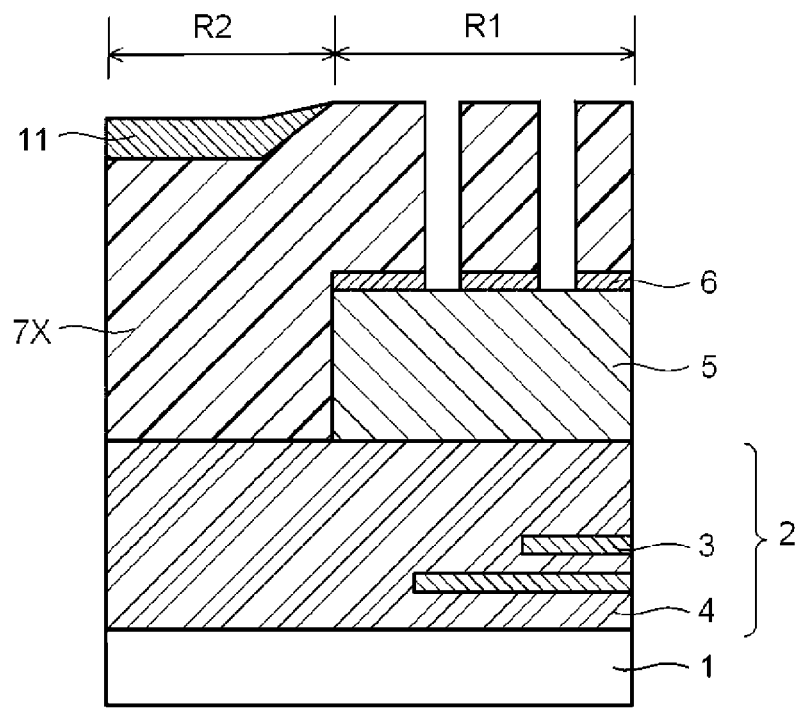
FIG. 20 is a view illustrating one process in the pattern forming method and the method for manufacturing a semiconductor device according to the second embodiment.

Next, as illustrated in FIG. 18, a resist 12 is applied on the SOG 11, and a desired pattern is formed in the resist 12 in the first region R1 by a lithography process. The pattern is transferred to the SOG 11 using the resist 12 as a mask, and the pattern is further transferred to the organic film 7X using the SOG 11 as a mask. Subsequently, the anti-reflection film 6 is processed using the organic film 7X as a mask. At this time, although the SOG 11 is also etched, the thickness of the SOG 11 is thicker in the second region R2 than in the first region R1 (FIG. 19), and thus, there is a time during which the SOG 11 in the first region R1 is lost, and the SOG 11 in the second region R2 remains. By adjusting the film thickness of the SOG 11, when the processing on the anti-reflection film 6 is ended, the SOG 11 in the first region R1 may be lost and the SOG 11 in the second region may remain (FIG. 20).

Figure 21:
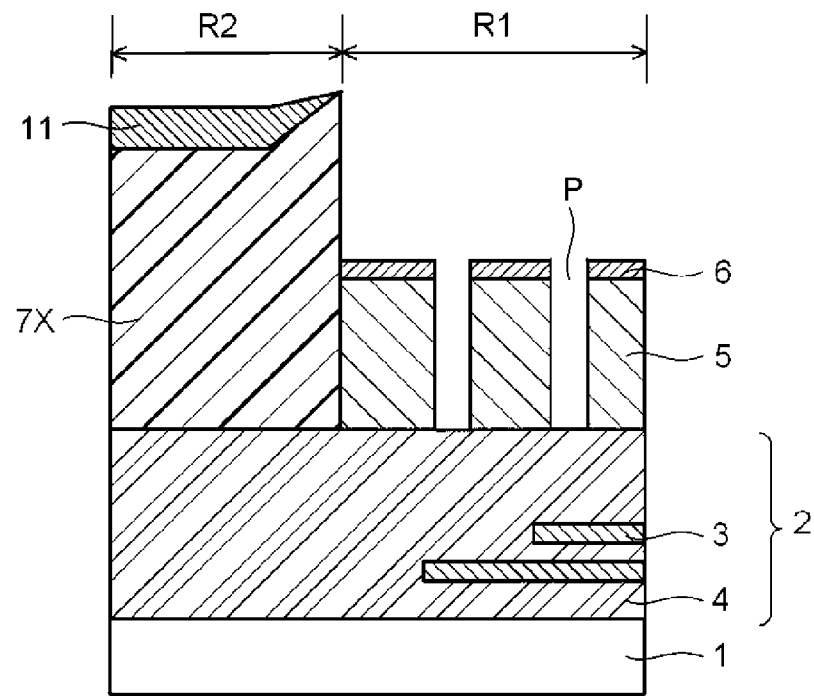
FIG. 21 is a cross-sectional view illustrating one process in the pattern forming method and the method for manufacturing a semiconductor device according to the second embodiment.
Figure 22:
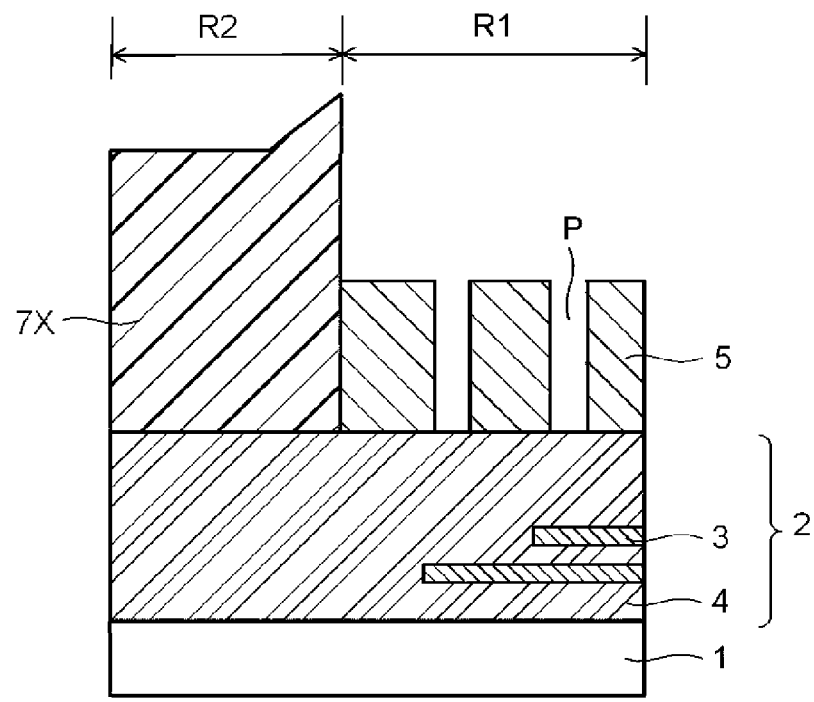
FIG. 22 is a cross-sectional view illustrating one process in the pattern forming method and the method for manufacturing a semiconductor device according to the second embodiment.

From this state, the CVD-carbon film 5 is processed. When using a gas such as O$_2$, CO, or COS containing oxygen atoms, or N$_2$ gas or CH$_4$ gas, or a mixed gas thereof as the etching gas, a selectivity is obtained between the SOG 11 and the anti-reflection film 6, and the CVD-carbon film 5 and the organic film 7X may be simultaneously etched by, for example, RIE. When the organic film 7X in the first region R1 is lost, and the processing on the CVD-carbon film 5 is ended, the etching is ended. At this time, a structure illustrated in FIG. 21 is obtained by adjusting the thickness of the applied film of the SOG 11 in advance such that the SOG 11 in the second region R2 remains. Next, as illustrated in FIG. 22, the SOG 11 is removed by RIE to expose the surface of the organic film 7X. At this time, the anti-reflection film 6 may be lost or remain.

Figure 23:
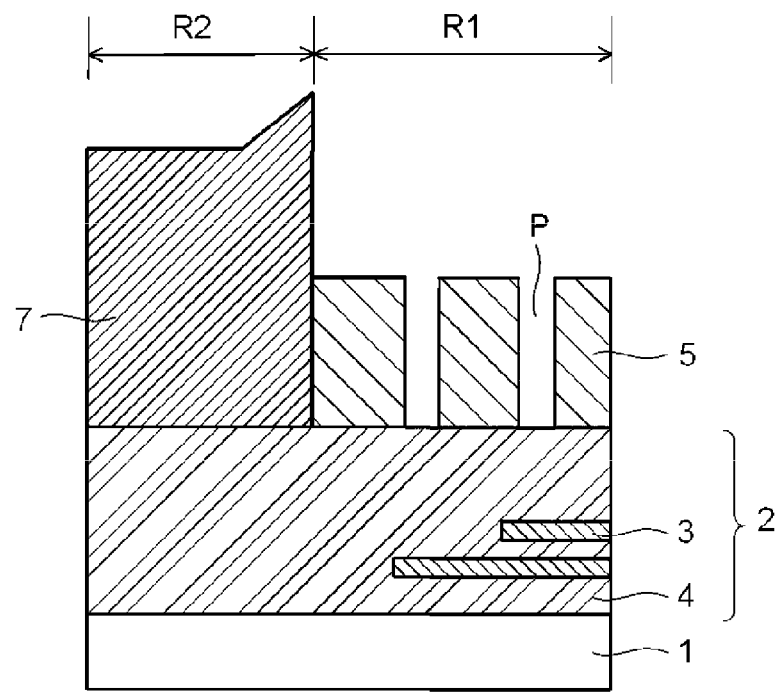
FIG. 23 is a cross-sectional view illustrating one process in the pattern forming method and the method for manufacturing a semiconductor device according to the second embodiment.

Next, the organic film 7X is infiltrated with metal. The method for infiltrating the organic film 7X with metal is as described in the first embodiment. For example, the substrate 1 on which each of the films is formed is put into a vacuum bath, and is heated to about 80° C. to 300° C., and, a precursor gas containing metal is introduced. Here, TMA is used as the precursor gas. The temperature of the substrate is set to 200° C., and TMA is introduced at 900 Pa and the substrate 1 is exposed for ten minutes. Further, water vapor is introduced to oxidize the metal, and the metal is immobilized in the resin. In this manner, as illustrated in FIG. 23, Al is bonded to the double bonding portion of oxygen in the organic film 7X to form the metal-containing organic film 7 serving as the second film.

Figure 24:
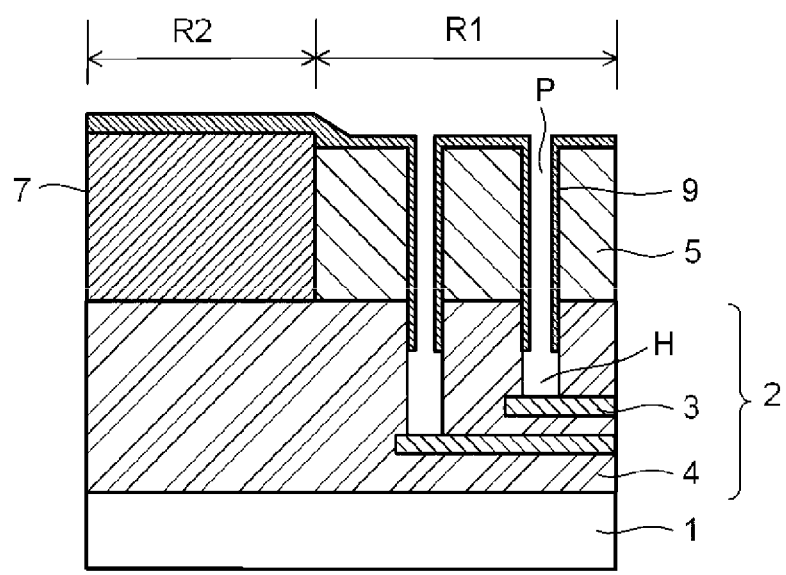
FIG. 24 is a cross-sectional view illustrating one process in the pattern forming method and the method for manufacturing a semiconductor device according to the second embodiment.

Next, $SiO_2$ film 2 which is the processing target film is processed. Although the mask at this time is the CVD-carbon film 5, the metal-containing organic film 7 in the second region R2 is also simultaneously etched, and thus, byproducts containing metal is produced and deposited on the surface of the first film 5, further, in the hole pattern P. As illustrated in FIG. 24, since the deposit 9 is also formed in the hole pattern P of the first film 5, and the deposit 9 contains metal, etching is inhibited. Therefore, the etching rate of the mask is decreased as compared to a carbon film that does not contain metal such as the CVD-carbon film 5. As illustrated in FIG. 24, the processing target film 2 is etched using the first film 5 having the hole pattern P as a mask by applying dry etching such as RIE or IBE to form the contact hole H in the processing target film 2. At this time, since the aspect ratio of the processing target film 2 is high, the deposit 9 is less attached to the hole bottom of the processing target film 2, and thus, the etching rate of the processing target film 2 is not decreased when forming the hole pattern P.

In the embodiment, an organic film containing 20 atom % of Al is used as the metal-containing organic film. As the etching gas, a mixed gas of a fluorocarbon-based gas such as $C_4F_8$, $C_4F_6$, $C_5F_8$, $CF_4$, $CHF_3$, $CH_2F_2$, and $CH_3F$, and $O_2$, CO, $CO_2$, $N_2$, He, Ar, Kr, and Xe is used. Here, etching is performed by using a mixed gas of $C_4F_6$, $O_2$, $N_2$, and Ar as the etching gas. Under such etching conditions, the etching rate of the first film 5 which is the mask is decreased by 15%, and the etching rate of $SiO_2$ film 2 which is the processing target film is not decreased. When the etching rate of the processing target film 2 is decreased or it is required to further decrease the etching rate of the mask, it may be adjusted by changing the metal concentration in the metal-containing organic film, or increasing the area of the first region R1 to reduce the area of the second region R2. While the processing target film 2 is processed, the metal-based deposit 9 is continuously supplied from the metal-containing organic film, and thus, it is possible to maintain a state having a high selectivity until the end of etching.

Figure 25:
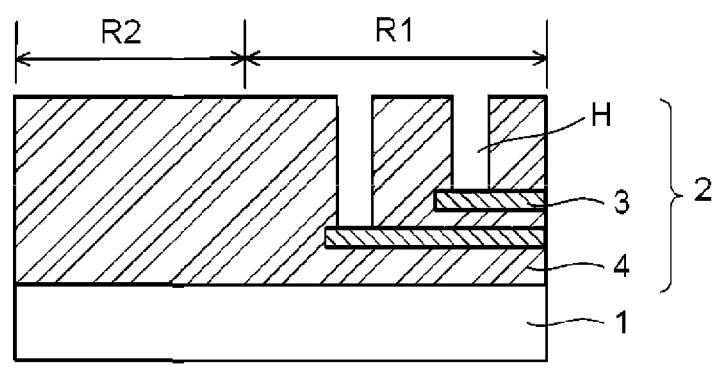
FIG. 25 is a cross-sectional view illustrating one process in the method for manufacturing a semiconductor device according to the second embodiment.
Figure 26:
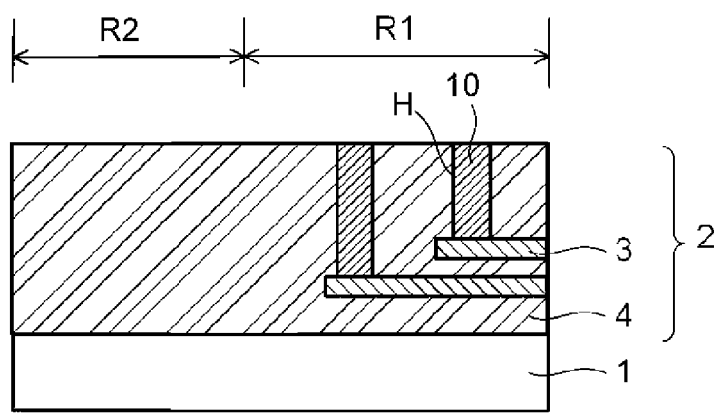
FIG. 26 is a cross-sectional view illustrating one process in the method for manufacturing a semiconductor device according to the second embodiment.

After processing the processing target film 2 by applying each process of the pattern forming method, the CVD-carbon film 5, the anti-reflection film 6, the metal-containing organic film 7, and the deposit 9 containing metal in the contact hole H are removed by applying an asking process or a wet etching process (see FIG. 25). Thereafter, as illustrated in FIG. 26, the metal material 10 such as W serving as a conductive material is embedded in the contact hole H, and further, the surface is flattened by chemical mechanical polishing (CMP), and thus, a vertical wiring layer having a high aspect ratio may be obtained.

The pattern forming method and the method for manufacturing a semiconductor device according to the second embodiment are not limited to the formation of the contact hole H. For example, the pattern forming method of the embodiment may be applied to the formation of a memory hole in a manufacturing process of a three-dimensional stacked non-volatile memory device having a memory cell having a vertical transistor structure. That is, the pattern forming method of the embodiment may be applied when forming a memory hole or a contact hole with respect to a stacked film of a silicon nitride film and a silicon oxide film applied to form a memory cell.

Third Embodiment

Figure 27:
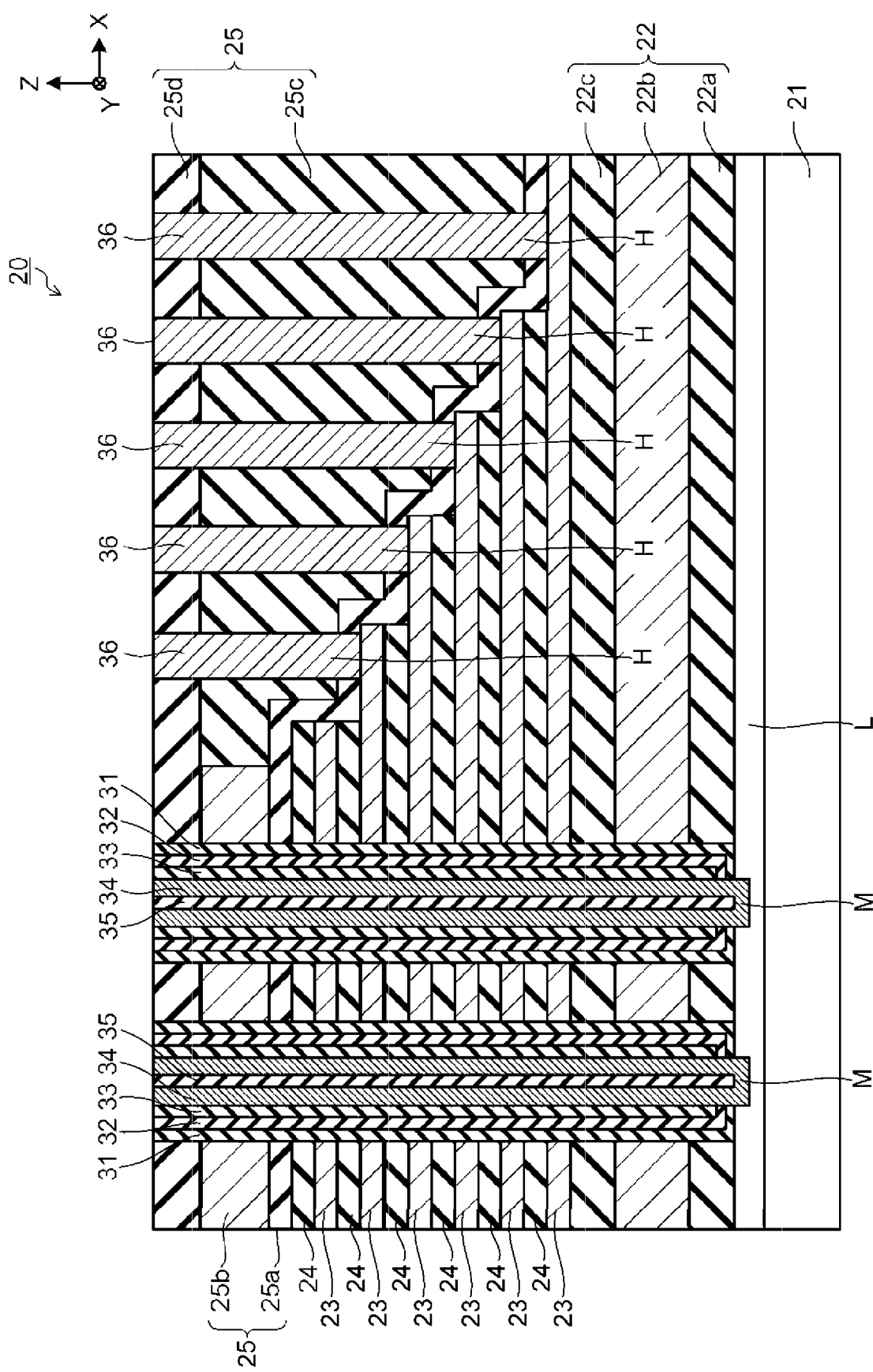
FIG. 27 is a cross-sectional view illustrating a semiconductor device to which the pattern forming method and the method for manufacturing a semiconductor device according to a third embodiment are applied.

Next, a pattern forming method and a method for manufacturing a semiconductor device according to a third embodiment will be described with reference to the FIGS. 27 to 34. FIG. 27 is a cross-sectional view of a semiconductor device manufactured by applying the pattern forming method and the method for manufacturing a semiconductor device according to the third embodiment. A semiconductor device 20 illustrated in FIG. 27 is a three-dimensional stacked non-volatile memory device, and includes a substrate 21, a lower layer 22, a plurality of electrode layers 23, a plurality of insulating layers 24, an upper layer 25, a plurality of memory hole M, and a plurality of contact holes H. The semiconductor device 20 includes a block insulating film 31, a charge storage film 32, a tunnel insulating film 33, a channel semiconductor layer 34, and a core insulating film 35 provided in each memory hole M in turn, and a contact plug 36 provided in each contact hole H.

The substrate 21 is, for example, a semiconductor substrate such as a silicon (Si) substrate. In FIG. 27, the directions that are parallel to the surface of the substrate 21 and are perpendicular to each other are referred to as the X direction and the Y direction, and the direction that is perpendicular to the surface of the substrate 21 is referred to as the Z direction. The +Z direction is the upward direction, and the −Z direction is the downward direction. The −Z direction may or may not coincide with the direction of gravity.

The lower layer 22 is formed on a diffusion layer L formed in the substrate 21, and includes a first lower insulating film 22a, a source side conductive layer 22b, and a second lower insulating film 22c formed on the substrate 21 in turn. The first lower insulating film 22a is, for example, a silicon oxide film ($SiO_2$). The source side conductive layer 22b is, for example, a polysilicon layer. The second lower insulating film 22c is, for example, a silicon oxide film ($SiO_2$).

The plurality of electrode layers 23 and the plurality of insulating layers 24 are alternately stacked on the lower layer 22. The electrode layer 23 is, for example, a metal layer such as a tungsten (W) layer or a molybdenum (Mo) layer, or a semiconductor layer such as a polysilicon layer, and functions as a word line. The insulating layer 24 is, for example, a silicon oxide film. The semiconductor device 20 includes the plurality of memory holes M that penetrates a stacked film including the electrode layers 23 and the insulating layers 24, and the plurality of contact holes H formed in a stair region of the stacked film including the electrode layers 23 and the insulating layers 24.

The upper layer 25 is formed on the stacked film including the electrode layers 23 and the insulating layers 24 described above, and includes a cover insulating film 25a, a drain side conductive layer 25b, a first interlayer insulating film 25c, and a second interlayer insulating film 25d. The cover insulating film 25a is formed on the stacked film. The drain side conductive layer 25b is positioned in a region where a plurality of memory holes M is formed adjacent to the stair region, and is formed on the cover insulating film 25a such that the plurality of memory holes M penetrate. The first interlayer insulating film 25c is formed on the cover insulating film 25a so as to embed the space on the stair region. The second interlayer insulating film 25d is formed on the drain side conductive layer 25b and the first interlayer insulating film 25c. Each of the cover insulating film 25a, the first interlayer insulating film 25c, and the second interlayer insulating film 25d is, for example, a silicon oxide film. The drain side conductive layer 25b is, for example, a polysilicon layer.

The block insulating film 31, the charge storage film 32, the tunnel insulating film 33, the channel semiconductor layer 34, and the core insulating film 35 are formed in turn on the side surface of each memory hole M that penetrates the lower layer 22, the plurality of electrode layers 23, the plurality of insulating layers 24, and the upper layer 25. Based on such configuration, a plurality of memory cells is formed in the Z direction in each memory hole M, respectively. The block insulating film 31 is, for example, a silicon oxide film. The charge storage film 32 is, for example, a silicon nitride film (SiN). However, the charge storage film 32 may be a semiconductor layer such as a polysilicon layer. The tunnel insulating film 33 is, for example, a silicon oxide film. The channel semiconductor layer 34 is a semiconductor layer such as a polysilicon layer, and is electrically connected to the diffusion layer L formed in the substrate 21. The core insulating film 35 is, for example, a silicon oxide film.

In the stair region, a plurality of contact plugs 36 is formed in a plurality of contact holes H that penetrates the upper layer 25. With respect to the electrode layers 23 disposed in a stair shape, the contact plugs 36 are electrically connected to different electrode layers 23, respectively. Each contact plug 36 is made of, for example, a barrier metal layer such as a titanium (Ti)-containing layer or a tantalum (Ta)-containing layer, and a plug material layer such as a tungsten layer, a copper (Cu) layer, and an aluminum (Al) layer.

Next, a memory hole M forming process will be described with reference to FIGS. 28 to 34. In FIGS. 28 to 34, a stacked film S of the lower layer 22, a plurality of sacrifice layers 26, the plurality of insulating layers 24, and the upper layer 25 formed in turn on the substrate 21 becomes a processing target film. As will be described later, the sacrifice layer 26 is configured to provide a space V for forming the electrode layer 23, and is, for example, a silicon nitride film (SiN). The sacrifice layer 26 is etched and removed by the following process, and the space formed by etching the sacrifice layer 26 is filled with a material of the electrode layer 23, for example, tungsten to form the electrode layer 23. In this manner, the stacked film of the electrode layer 23 and the insulating layer 24 is formed. The stacked film of the electrode layer 23 and the insulating layer 24 may be directly formed without applying the sacrifice layer 26.

Figure 28:
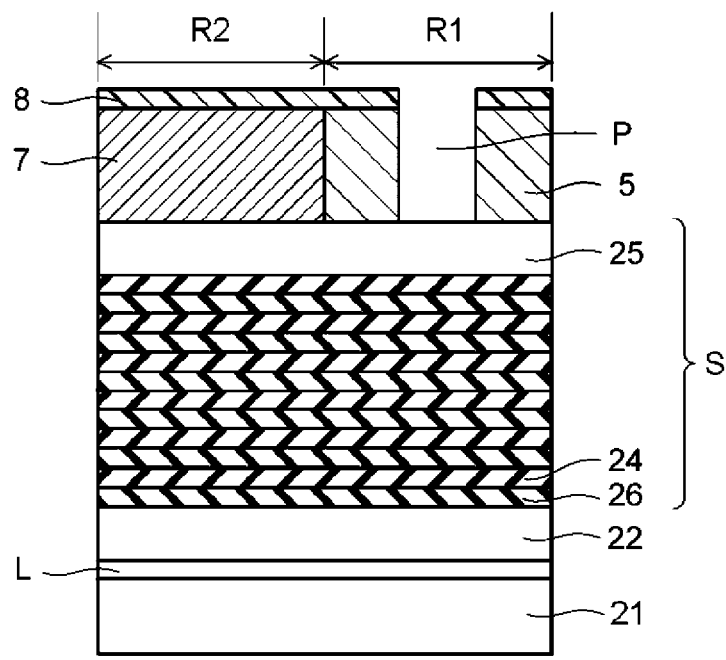
FIG. 28 is a cross-sectional view illustrating one process in a method for manufacturing a semiconductor device according to the third embodiment.

First, as illustrated in FIG. 28, the first film 5 such as the CVD-carbon film is formed in the first region R1 of the above stacked film S, and the second film 7 made of the metal-containing organic film is formed in the second region R2. The forming processes of the first film 5 and the second film 7 are performed in the same manner as in the first embodiment described above. In the forming processes of the first film 5 and the second film 7, the forming processes described in the second embodiment described above may be applied. Next, the resist film 8 is formed on the first film 5 and the second film 7, and then, a lithography process is applied to the portion corresponding to the first region R1 of the resist film 8 to form a desired resist pattern. The resist pattern is formed according to the shape of the memory hole M. The resist pattern is transferred to the first film 5 by, for example, RIE (FIG. 28). Here, the hole pattern P is formed.

Figure 29:
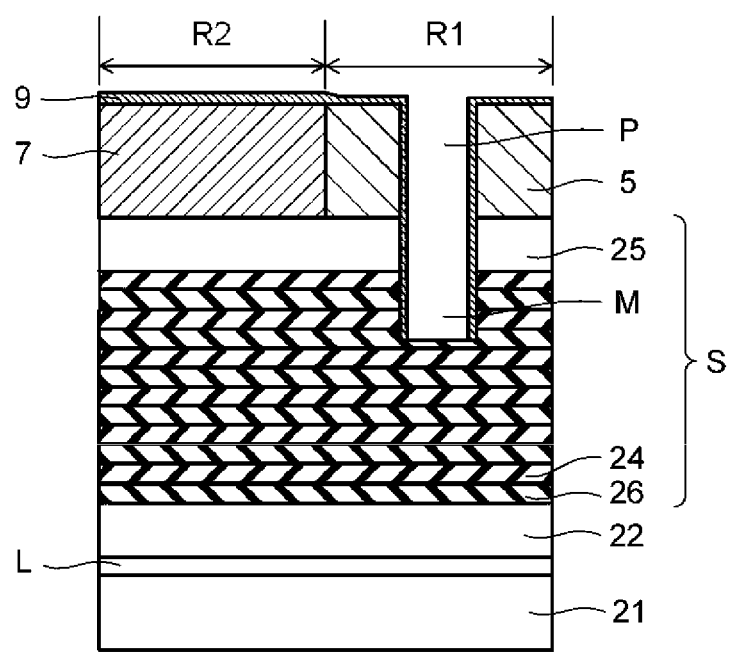
FIG. 29 is a cross-sectional view illustrating one process in the method for manufacturing a semiconductor device according to the third embodiment.

Next, as illustrated in FIG. 29, the stacked film S which is the processing target film is processed using the first film 5 and the second film 7 on which the hole pattern P is formed as a mask. When etching the stacked film S, although the first film 5 having the hole pattern P functions as a mask, the second film 7 made of the metal-containing organic film is also exposed, and thus, the second film 7 is also simultaneously etched. By etching the metal-containing organic film of the second film 7, metal-containing byproducts are produced. The produced byproducts are deposited (deposit 9) on the surface of the first film 5 or in the hole pattern P. Since the deposit 9 is also formed in the hole pattern P of the first film 5, and the deposit 9 contains metal, etching is inhibited. Therefore, the etching rate of the mask is decreased as compared to a carbon film that does not contain metal such as the CVD-carbon film. The stacked film S is etched using the first film 5 as a mask by applying dry etching such as RIE or IBE to form the memory hole M in the stacked film S. At this time, since the aspect ratio of the memory hole M is high, the deposit 9 is less attached to the hole bottom of the memory hole M formed in the stacked film S, and thus, the etching rate of the stacked film S is not decreased.

Also in this embodiment, similar to the first embodiment, an organic film containing 20 atom % of Al is used as the metal-containing organic film. As the etching gas, a mixed gas of a fluorocarbon-based gas such as $C_4F_8$, $C_4F_6$, $C_5F_8$, $CF_4$, $CHF_3$, $CH_2F_2$, and $CH_3F$, and $O_2$, CO, $CO_2$, $N_2$, He, Ar, Kr, and Xe is used. Under such etching conditions, the etching rate of the first film 5 which is the mask is decreased by 15%, and the etching rate of stacked film S which is the processing target film is not decreased. When the etching rate of the processing target film is decreased or it is required to further decrease the etching rate of the mask, it may be adjusted by changing the metal concentration in the metal-containing organic film, or increasing the area of the first region R1 to reduce the area of the second region R2. While the processing target film is processed, the metal-based deposit 9 is continuously supplied from the metal-containing organic film, and thus, it is possible to maintain a state having a high selectivity until the end of etching.

Figure 30:
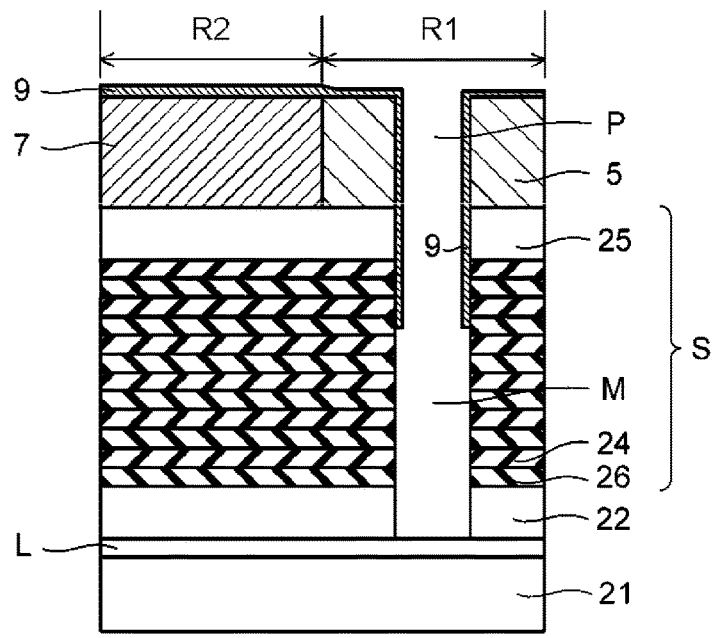
FIG. 30 is a cross-sectional view illustrating one process in the method for manufacturing a semiconductor device according to the third embodiment.
Figure 31:
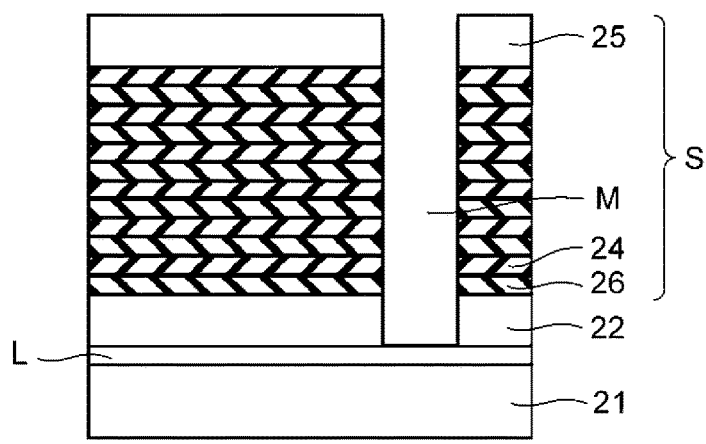
FIG. 31 is a cross-sectional view illustrating one process in the method for manufacturing a semiconductor device according to the third embodiment.

In this manner, as illustrated in FIG. 30, the memory hole M having a predetermined depth is formed in the first region R1 of the stacked film S which is the processing target film. Next, as illustrated in FIG. 31, the first film 5 such as the CVD-carbon film, the second film 7 which is the metal-containing organic film, and the metal-containing deposit 9 deposited, which includes the deposit 9 deposited inside the memory hole M, are removed by applying an asking process or a wet etching process. Subsequently, as illustrated in FIGS. 32 to 34, each of the films 31, 32, 33, 34, and 35 that constitutes the memory cell in the memory hole M is formed.

Figure 32:
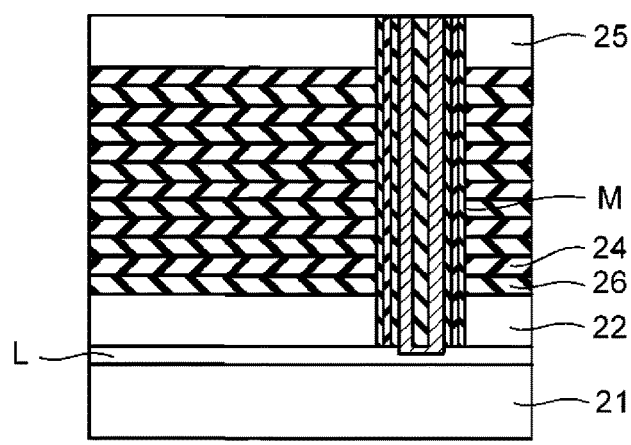
FIG. 32 is a cross-sectional view illustrating one process in the method for manufacturing a semiconductor device according to the third embodiment.

As illustrated in FIG. 32, the block insulating film 31, the charge storage film 32, and the tunnel insulating film 33 are formed in turn in the memory hole M. Further, a side wall film (e.g., silicon oxide film) (not illustrated) is formed on the tunnel insulating film 33. The lower portion of each of the films 31, 32, and 33 and lower layer 22 are etched using the RIE method using the side wall film as a mask to expose the diffusion layer L. Subsequently, the side wall film of the mask is etched by selective RIE to expose the tunnel insulating film 33. The channel semiconductor layer 34 is formed along the inner wall of the tunnel insulating film 33, and the channel semiconductor layer 34 is electrically connected to the diffusion layer L. After that, the core insulating film 35 is embedded inside the channel semiconductor layer 34 (FIG. 32).

Figure 33:
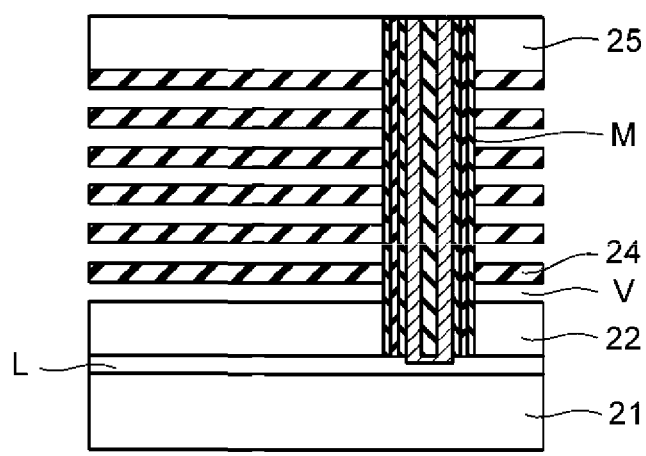
FIG. 33 is a cross-sectional view illustrating one process in the method for manufacturing a semiconductor device according to the third embodiment.
Figure 34:
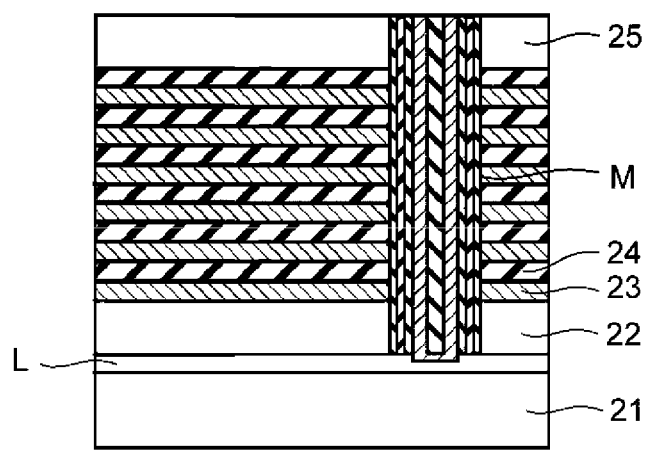
FIG. 34 is a cross-sectional view illustrating one process in the method for manufacturing a semiconductor device according to the third embodiment.

Next, after forming a slit (not illustrated) in the stacked film of the sacrifice layer 26 and the insulating layer 24, as illustrated in FIG. 33, the sacrifice layer (silicon nitride film) 26 is etched by, for example, phosphoric acid heated to 150° C. through the slit, and the space (filling space) V for forming the electrode layer 23 is formed. Subsequently, as illustrated in FIG. 34, for example, a Ta layer is filled with the space V to form the electrode layer 23, and thus, a stacked body of the electrode layer 23 and the insulating layer 24 is manufactured. Thereafter, for example, W in the unnecessary portion is removed, and a silicon oxide film is embedded, and then, an upper wiring (not illustrated) is formed to manufacture the semiconductor device (three-dimensional stacked non-volatile memory device) 20.

In the semiconductor device 20 illustrated in FIG. 27, the contact hole H in the stair region of the stacked film including the electrode layer 23 and the insulating layer 24 may be formed by applying the process illustrated in the first embodiment or in the second embodiment. In this manner, the semiconductor device 20 which is a three-dimensional stacked non-volatile memory device is manufactured. In the manufacturing process of the semiconductor device 20, when forming the contact hole H or the memory hole M having a high aspect ratio, the pattern shape may be maintained by increasing the etch resistance of the mask, and thus, it is possible to improve formability or shape accuracy of the contact hole H or the memory hole M. Therefore, it is possible to increase manufacturing yield or productivity of the semiconductor device 20.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern forming method comprising:
   forming a first film on a first region of a processing target film;
   forming a second film containing metal and carbon, the second film being different from the first film, on a second region of the processing target film;
   etching the first film; and
   after etching the first film, etching the processing target film using the first film as a mask, the second film being exposed to the etching of the processing target film,
   wherein, in the etching the processing target film, forming a metal-containing deposit generated by the etching of the second film in a pattern of the processing target film at the same time as the etching of the processing target film.

2. The pattern forming method according to claim 1, wherein the first film contains carbon.

3. The pattern forming method according to claim 1, wherein the forming the second film includes forming an organic film on the second region, and infiltrating the organic film with metal.

4. The pattern forming method according to claim 1, wherein the forming the second film includes applying a metal-containing organic substance onto the second region.

5. The pattern forming method according to claim 1, wherein the metal includes at least one selected from the group consisting of aluminum, titanium, zirconium, hafnium, vanadium, tungsten, and indium.

6. The pattern forming method according to claim 1, wherein the second film is thicker the first film.

7. The pattern forming method according to claim 1, wherein the first film is an amorphous silicon film or a carbon film.

8. The pattern forming method according to claim 1, wherein the processing target film includes an insulating film.

9. The pattern forming method according to claim 8, wherein the insulating film includes at least one wiring layer.

10. The pattern forming method according to claim 1, further comprising:
    forming an anti-reflective layer on the first film, and
    forming a photoresist on the anti-reflective layer.

11. The pattern forming method according to claim 10, wherein a total thickness of the first film plus the anti-reflective layer is equal to a thickness of the second film.

12. The pattern forming method according to claim 1, wherein the metal-containing deposit reduces etching.

13. A method for manufacturing a semiconductor device comprising:
    providing a semiconductor substrate with a processing target film formed thereon;
    forming a first film on a first region of the processing target film;
    forming a second film containing metal and carbon, the second film being different from the first film, on a second region of the processing target film;
    etching the first film; and
    after etching the first film, etching the processing target film using the first film as a mask, the second film being exposed to the etching of the processing target film,
    wherein, in the etching the processing target film, forming a metal-containing deposit generated by the etching of the second film in a pattern of the processing target film at the same time as the etching of the processing target film.

14. The method according to claim 13, wherein the first film contains carbon.

15. The method according to claim 13, wherein the forming the second film includes forming an organic film on the second region, and infiltrating the organic film with metal.

16. The method according to claim 13, wherein the forming the second film includes applying a metal-containing organic substance onto the second region.

17. The method according to claim 13, wherein the metal includes at least one selected from the group consisting of aluminum, titanium, zirconium, hafnium, vanadium, tungsten, and indium.

18. The method according to claim 13, wherein the second film is thicker the first film.

19. The method according to claim 13, wherein the metal-containing deposit reduces etching.

* * * * *